United States Patent [19]

Ishihara

[11] Patent Number: 4,806,386

[45] Date of Patent: Feb. 21, 1989

[54] METHOD FOR FORMING DEPOSITED FILM

[75] Inventor: Shunichi Ishihara, Ebina, Japan

[73] Assignee: Canon Kabushiki Kaisha, Tokyo, Japan

[21] Appl. No.: 33,463

[22] Filed: Apr. 2, 1987

Related U.S. Application Data

[62] Division of Ser. No. 751,423, Jul. 3, 1985, Pat. No. 4,674,434.

[30] Foreign Application Priority Data

Jul. 9, 1984 [JP] Japan .................................. 59-140469

[51] Int. Cl.$^4$ ............................................. B05D 3/06
[52] U.S. Cl. ........................................ 427/39; 427/55; 427/402
[58] Field of Search .................... 427/39, 93, 95, 55

[56] References Cited

U.S. PATENT DOCUMENTS

| 4,401,689 | 8/1983 | Ban | 427/55 |
| 4,532,196 | 7/1985 | Yasui et al. | 427/39 |

*Primary Examiner*—Bernard Pianalto
*Attorney, Agent, or Firm*—Fitzpatrick, Cella, Harper & Scinto

[57] ABSTRACT

An apparatus for forming a deposited film comprises a chamber, which can be brought into a reduced pressure, for forming a deposited film on a substrate by introducing a starting gas into said chamber and decomposing or polymerizing said gas, the apparatus is provided with both a means for decomposing or polymerizing said gas by discharging and a means for decomposing or polymerizing said gas by heat.

9 Claims, 1 Drawing Sheet

METHOD FOR FORMING DEPOSITED FILM

This is a division of application Ser. No. 751,423, filed July 3, 1985, now U.S. Pat. No. 4,674,434.

BACKGROUND OF THE INVENTION

1. Field of the Invention

This invention relates to an apparatus for forming a deposited film, for example, a deposited film of an amorphous material comprising silicon atoms as the main component (hereinafter abbreviated as a-Si), etc. on a substrate.

2. Description of the Prior Art

In the following, this type of technique is explained by referring to an embodiment employing a-Si for an electrophotographic photosensitive member.

Generally speaking, an electrophotographic photosensitive member is constituted by laminating various kinds of functional layers such as photoconductive layer, charge injection preventive layer, protective layer, etc. on a substrate having a desired shape such as cylinder, etc. Of such electrophotographic photosensitive members, the electrophotographic photosensitive member employing a-Si as the functional layer as mentioned above is attracting attention as a substitute for the electrophotographic photosensitive member employing an amorphous selenium of the prior art for the various advantages possessed by a-Si, for example, little change with lapse of time, no environmental contamination, high surface hardness, etc.

FIG. 2 is a schematic illustration of the structure of a typical example of such an electrophotographic photosensitive member employing a-Si.

In FIG. 2, 1' is a substrate which is usually made of an aluminum drum. 2' is a charge injection preventive layer which prevents injection of charges from the substrate 1' into the photoconductive layer 3' and laminated on the substrate 1'. For example, when charging is effected by corona charging of ⊕ polarity, it is necessary to prevent injection of ⊖ from the charge injection preventive layer 2' into the photoconductive layer 3'. Ordinarily, the charge injection preventive layer 2' is constituted of a-Si doped with elements having trivalent valance such as boron (B) (the layer is of P+a-Si), in which a mobility of electrons is made smaller by said elements to effect injection prevention of charges.

On the charge injection preventive layer 2' is laminated a photoconductive layer 3', which is ordinarily constituted of a non-doped a-Si layer. On this photoconductive layer 3' is further laminated a protective layer 4' to constitute an electrophotographic photosensitive member. The protective layer 4' is provided for further improvement of durability, and this is ordinarily constituted of an a-Si with broad band gap containing carbon (C) atoms (a-SiC layer). Thus, the constitution of an electrophotdgraphic photosensitive member is generally made a four layer constitution of Al/P+a-Si/non-doped a-Si/a-SiC.

The respective functional layers of such a photosensitive member are generally prepared according to the plasma decomposition method utilizing flow discharging. However, the plasma decomposition method involves the problems as mentioned below, and such problems are particularly marked in the case of preparing a layer with a thick layer thickness such as non-doped a-Si layer, which requires a layer thickness of about 20 μm or more.

That is to say, (1) the gases such as $SiH_4$, $Si_2H_6$, etc. used as the starting gas tend to spontaneously combust, and film preparation is accompanied with danger and disposal of waste gases (2) while decomposition efficiency of the starting gas is required to be increased in order to increase the film deposition speed, the applied voltage must be made higher for this purpose, but increased applied voltage will inevitably result in increase in species of radicals or ions generated by decomposition of the starting gas, whereby those having deleterious effects on the film characteristics may also be increased; (3) for obtaining uniform film characteristics, discharging is required to be effected uniformly, but such control of discharging is difficult for a product with large area such as an electrophotographic photosensitive member.

The methods which have been proposed for preparing an electrophotographic photosensitive member having excellent film characteristics by cancelling such problems are the so called pyrolysis methods in which radicals are formed. Among these, the method for preparing non-doped a-Si layer photoconductive layer through utilization of the pyrolysis reaction:

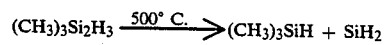

is a method excellent with respect to safety, because $(CH_3)_3SiH$, and $(CH_3)_3Si_2H_3$ are gases that do not spontaneously combust. It has also the advantages that film characteristics are easily controlled due to relatively limited species of radicals being generated in the pyrolysis method as compared to the plasma decomposition method, as well as high film deposition speed. It is also possible to prepare P+ a-Si layer by using in the pyrolysis reaction a gas for doping such as $B_2H_6$, etc. The film characteristics of these functional layers have better quality than those obtained by the plasma decomposition method.

However, concerning a-SiC layer, it has been difficult to prepare this according to the pyrolysis method, since both $SiH_2$ and $CH_2$ cannot be formed into the layer.

SUMMARY OF THE INVENTION

The present invention has been accomplished in view of the various points as described above, and an object of the present invention is to cancel the problems in the prior art examples and provide a novel apparatus for forming a deposited film which is capable of forming a deposited film through utilization of both decomposition or polymerization utilizing heat and decomposition or polymerization utilizing discharging.

Another object of the present invention is to provide an apparatus for forming a deposited film comprising a chamber, which can be brought into a reduced pressure, for forming a deposited film on a substrate by introducing a starting gas into said chamber and decomposing or polymerizing said gas, said device being provided with both a means for decomposing or polymerizing said gas by discharging and a means for decomposing or polymerizing said gas by heat.

Still another object of the present invention is to provide a method for forming a deposited film on a substrate which comprises forming a part of said deposited film by decomposition or polymerization of the starting gas by heat and forming at least a part of the remainder of the deposited film by decomposition or polymerization of the starting gas by discharging.

DETAILED DESCRIPTION OF THE PREFERRED EMBODIMENTS

Figure 1:
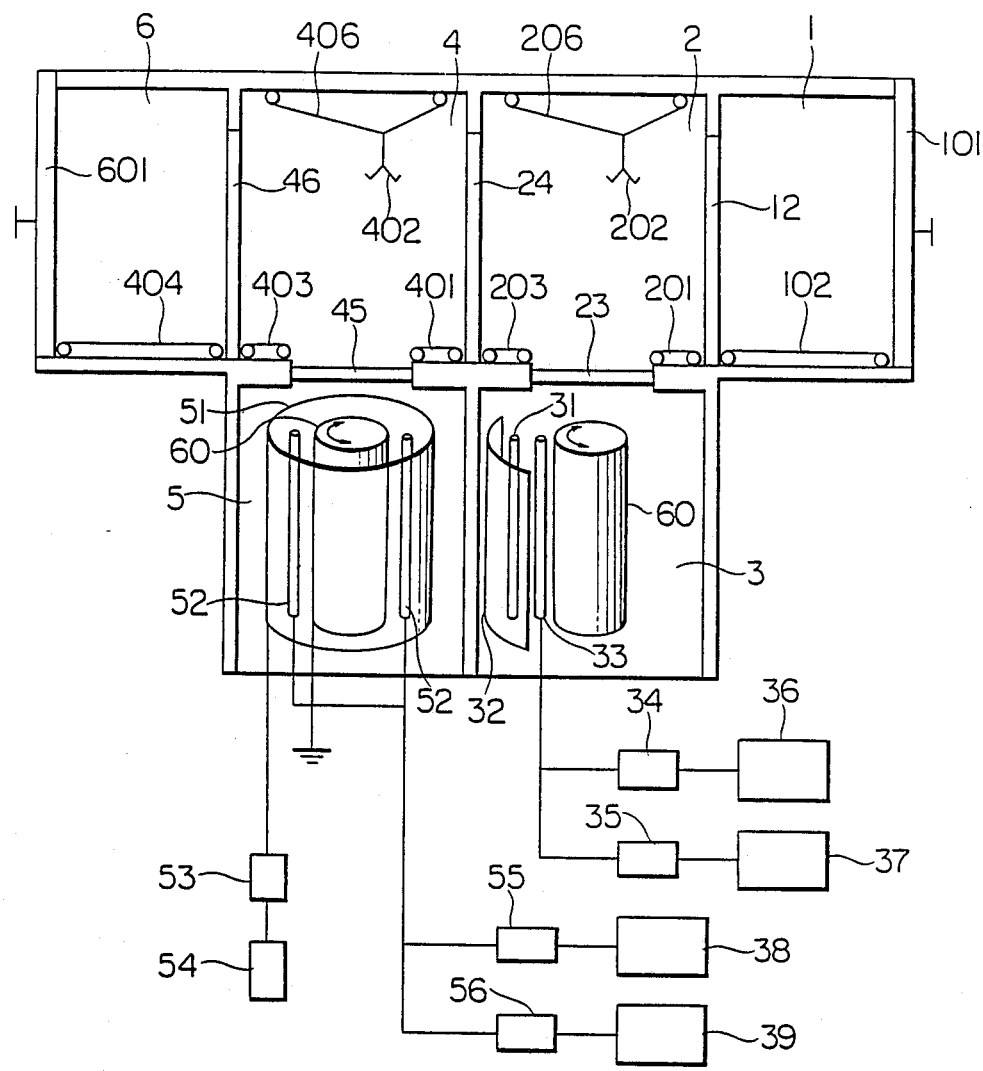
FIG. 1 is a schematic illustration of the structure of an embodiment of the apparatus of the present invention.

Referring now to FIG. 1, the present invention is to be described in detail.

FIG. 1 is a schematic illustration of the construction of an example of the device of the present invention.

As shown in FIG. 1, the apparatus of the present invention is provided with six vacuum compartments shown by 1-6 adjacent to each other, each of which can function as an independent chamber. Between the respective adjacent compartments are provided gate valves freely openable by the mechanism not shown so that each chamber may function internally as a chamber independent of each other. Also, in each of these vacuum compartments, there is provided an evacuation system comprising rotary pump, diffusion pump, etc. (not shown) so as to maintain the pressure in each compartment at a desired level independently of each other. Compartments 3 and 5 are vacuum compartments to be used as the deposition chambers for carrying out film formation, 3 being a compartment for carrying out film formation by utilization of heat and 5 being a compartment for carrying out film formation by utilization of discharging. 1, 2, 4 and 6 are vacuum compartments hereinafter called preliminary compartments) provided for delivering a substrate (in this example, Al drum 60 for electrophotographic photosensitive member) into and out of the compartment 3 and the compartment 5, and no film formation is conducted in these preliminary compartments.

The gate valves provided between the respective compartments function as the partition walls for separating the vacuum compartments from each other and also as the inlet or outlet for delivering the drum into or out of the respective compartments, and therefore should preferably be made of a system capable of automatic opening and closing.

Referring now to an example of the case of forming deposited films in compartments 3 and 5, respectively, by delivering a drum 60 from the preliminary compartment 1 into the device, and subsequently moving the drum in the order of the preliminary compartment, the compartment 3 utilizing heat for film formation, the preliminary compartment 2, the preliminary compartment 4, the compartment 5 utilizing discharging for film formation, the preliminary compartment 4, and the preliminary compartment 6, the constitutions and functions of the respective compartments are to be described. Of course, the order of drum movement is not restricted to this order, but various modifications may be possible. For example, the preliminary compartment 6 may be made the preliminary compartment for delivering the drum into the apparatus, and it is also possible to repeat film formation between the compartment 3 utilizing heat for film formation and the compartment 5 utilizing discharging for film formation, depending on the properties to be laminated. For example, as embodiments of the method of the present invention, first film formation is performed by utilization of heat, and then film formation by utilization of discharging; or alternatively film formation is performed by utilization of heat, then film formation by utilization of discharging and further film formation by utilization of heat; or other various procedures including the, reversed orders of these procedures may considered. These procedures can be selected optimally depending on the type of the deposited film, the layer constitution, etc. Delivery of the drum into the preliminary compartment 1 may be done through the freely openable door 101. For delivery of the drum, a drum delivering means such as hoist, not shown in the drawing, is employed. The drum delivered from outside of the system is placed on the belt conveyer 102. The conveyer 102 is a delivering means for drum movement within the preliminary compartment 1 and drum delivery into the preliminary compartment 2, and it is made freely rotatable. After delivery of the drum into the compartment, with the preliminary compartment 1 having the door 101 and the gate valve 12 closed, the preliminary compartment is internally evacuated. The evacuation operation is performed every time when the drum is delivered into the compartment, and the drum transfer is done when the pressure in the preliminary compartment 1 becomes approximately the same as that in the preliminary compartment 2. Transfer of the drum to the preliminary compartment 2 is performed by opening the gate valve 12 after completion of evacuation and transferring the drum from the conveyer 102 to the similar conveyer 201 to 102 provided in the preliminary compartment 2.

The drum delivered into the preliminary compartment 2 is suspended on the hoist 206 which is the drum delivering means for delivering the drum into compartment 3 in which layer formation is conducted by utilization of heat. 202 is a hanging metallic member which is the drum suspending means provided on said hoist. Drum transfer to the compartment 3 utilizing heat for film formation is performed by opening the gate valve 23, with the gate valves 12 and 24 closed.

The evacuation operation in the preliminary compartment 1 is required to be performed every time when the drum is delivered, before the drum is delivered from outside into the preliminary compartment 1. However, drum delivary from the preliminary compartment 1 to the preliminary compartment 2 is extened while maintaining the pressure within the system, and therefore it is possible to transfer the drum from the preliminary compartment 2 to the compartment 3 while maintaining the preliminary compartment 2 under vacuum condition. Accordingly, during film formation, the next drum can be delivered into the preliminary compartment 1 and the compartment 1 evacuated, and then it is possible to deliver the next drum immediately after transfer of the drum after film formation into the compartment 3 where film formation is conducted by utilization of heat, whereby evacuation operation requiring a long time can be shortened to improve productivity.

The drum delivered into the compartment 3 utilizing heat for film formation is set in close contact with the heat sink drum not shown in the drawing which is the drum holding means. The heat sink drum is equipped with a cooling tube through which cooling water for drum cooling is passed and a heater for drum heating, and the drum temperature is controlled by said cooling tube and heater. The starting gas is introduced into the compartment 3 through a gas introducing pipe 33. The gas introducing pipe 33 is equipped with gas charging orifices through which gas is uniformly charged onto the drum. The starting gas charged into the compartment 3 is decomposed by heating by IR-ray- lamp which is the gas heating means at a temperature of the decomposition temperature of said gas or higher. The gas decomposed by heating is attached on the drum to form a deposited film from said gas as the starting material on the drum. 32 is a reflection mirror which condenses IR-ray emitted from the IR-ray lamp 31 for improvement of heating efficiency of the IR-ray lamp and is provided to form a pair with the IR-ray lamp. Although these gas introducing pipe 33, IR-ray lamp 31 and reflection mirror 32 are shown in the drawing only one for each of them, they are actually provided in number of four at equal intervals, respectively. Of course, these members may be provided in any desired number. 34 and 35 are mass flow controllers for controlling the flow rates of the starting gases to be fed into the gas introducing pipe 33 and are connected to the gas feeding sources 36, 37, constituted of bombs, etc. (not shown in the drawing) respectively. In the drawing, the starting gas feeding system constituted of these mass flow controllers and bombs is made to consist of two systems, but it can also be made to consist of one system, or two or more systems, as desired.

The drum completed of film formation in the compartment 3 utilizing heat for film formation is suspended by the hoist 206 to be delivered out again into the preliminary compartment 2. The drum delivered into the preliminary compartment 2 is placed on the belt conveyer 203 provided for drum transfer between the preliminary compartments 2 and 4 and, following the same manner as in transfer between the preliminary compartments 1 and 2, delivered out into the preliminary compartment 4.

The preliminary compartment 4 is constituted internally similarly to the preliminary compartment 2, and the drum delivered into the preliminary compartment 4 is suspended by the hoist 406 similar to that in the preliminary compartment 2 to be delivered out of the compartment 4 into the compartment 5 utilizing discharging for film formation.

The drum delivered into the compartment 5 utilizing discharging for film formation is set on the same heat sink as in the compartment 3 utilizing heat for film formation. Although not explained in the compartment 3 utilizing heat for film formation, these heat sink drums are made rotatable as shown by the arrowhead in the drawing for the purpose of uniformizing the film thickness. The startinq gas is introduced through the gas introducing pipe 52 into the compartment 5 similarly as in the compartment 3 utilizing heat for film formation. The starting gas feeding system for feeding the starting gas to the gas introducing pipe 52 is also made to have the same constitution as the compartment 3 utilizing heat for film formation.

The starting gas introduced into the compartment 5 is decomposed by discharging which occurs between the drum and the electrode 51 placed concentrically outside thereof to form a deposited film on the drum. 54 is a high frequency power source for exciting discharging, and 53 is a matching box for applying stable high frequency wave to the electrode 51.

The drum completed of film formation in the compartment 5 utilizing discharging for film formation is delivered out again and into the preliminary compartment 4. Then, it is transferred into the preliminary compartment 6 having the same constitution as the preliminary compartment 1 and delivered out of the system through the door 601.

According to the apparatus provided with the compartment utilizing heat for film formation and the compartment utilizing discharging for film formation as shown in the above embodiment and the method by use thereof, formation of a deposited film is possible by utilizing heat and discharging, respectively. Accordingly, in preparation of an apparatus having a large area such as an electrophotographic photosensitive member as mentioned above, film formation may be performed primarily through utilization of heat which can form a film of good quality at high deposition speed on a substrate with such a large area, and a film such as of a-SiC which is formed with difficulty by heat can be formed by utilization of discharging, thus enabling film formations depending on the properties of the deposited films to be formed, whereby it has been rendered possible to form in apparatus having more excellent film characteristics than those of the prior art.

In the above embodiment, the substrate is transferred with the use of preliminary compartments provided in addition to the compartment utilizing heat for film formation and the compartment utilizing discharging for film formation, but provision of such preliminary compartment or provision of the compartment utilizing heat for film formation and the compartment utilizing discharging for film formation functioning as independent chambers is not necessarily required. The object of the present invention can also be accomplished by a constitution in which the substrate is transferred with the use of a gate valve as mentioned above between the compartment utilizing heat for film formation and.the compartment utilizing discharging for film formation or a constitution in which the gate valve between the compartment utilizing heat for film formation and the compartment utilizing discharging for film formation is removed and the compartment utilizing heat for film formation and the compartment utilizing discharging for film formation are allowed to function as one chamber. Of course, depending on various purposes such as improvement of productivity, etc., such preliminary compartments may be provided.

In the above embodiment, the substrate used is an aluminum drum for electrophotographic photosensitive member, but substrates of various shapes such as plates, cylinders, etc. and various materials may be available, Also, concerning the constitution of the compartment utilizing heat for film formation and the compartment utilizing discharging for film formation, the above embodiment is not limitative of the present invention, as a matter of course. In other words, concerning the compartment utilizing heat for film formation, it may be any compartment capable of film formation by decomposition or polymerization of the starting gas through utilization of heat energy, and any of the various systems known in the art such as gas discharging system, substrate heating system, etc. may be useful. On the other hand, concerning the compartment utilizing discharging for film formation, it may be any compartment capable of film formation by decomposition or polymerization of the starting gas through utilization of discharging energy, and any of the various systems known in the art such as gas discharging system, electrode setting system, ect. may be useful. These compartment utilizing heat for film formation and utilizing discharging for film formation may be provided in any number respectively as desired.

As the starting gas to be used in the present invention as described above, most gasifiable substances at normal temperature and normal pressure may be available. For example, gases containing silicon atoms as mentioned above such as $SiH_4$, $(CH_3)_3Si_2H_3$ can preferably be employed. Of course, in addition to these gases, doping gas such as $B_2H_6$, $CH_4$, etc. and a diluting gas such as Ar, etc. may be used as desired.

The present invention is described in more detail by referring to the following Examples.

EXAMPLE 1

Figure 2:
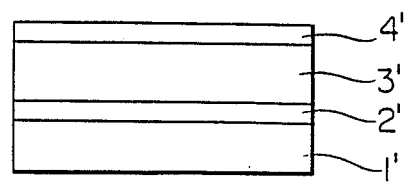
FIG. 2 is a schematic sectional view of a typical example of the construction of the electrophotographic photosensitive member.

By means of the apparatus shown in FIG. 1, an electrophotographic photosensitive member having functional film with three layer constitution similarly to that shown in FIG. 2 was prepared on an aluminum drum.

The aluminum drum was moved in the order of the preliminary compartment 1, the preliminary compartment 2 and the compartment 3 utilizing heat for film formation successively, and was set in the compartment 3 utilizing heat for film formation. After the pressure in the compartment 3 was made 0.3 Torr and the temperature of the aluminum 300° C.±10° C., $(CH_3)_3Si_2H_3$ gas at a flow rate of 100 cc/min. (controlled by the mass flow controller 34) and $B_2H_6$ gas diluted to 3000 ppm with $H_2$ gas ($B_2H_6/H_2$) at a flow rate of 10 cc/min. (controlled by the mass flow controller 35) were permitted to flow thereinto for 5 minutes to form P$^+$a-Si layer on the aluminum drum.

Then, the flow of $B_2H_6/H_2$ gas was stopped, with the flow rate of $(CH_3)_3Si_2H_3$ gas being increased to 200 cc/min., and this condition was maintained for 3 hours to form non-doped a-Si layer on the P$^+$a-Si layer.

The drum having the above two layers formed thereon was moved in the order of the preliminary compartment 2, the preliminary compartment 4 and the compartment 5 utilizing discharging for film formation successively, and was set in the compartment 5 utilizing discharging for film formation. After the pressure in the compartment 5 was made 0.2 Torr and the drum temperature 300° C.±10° C., $CH_4$ gas at a flow rate of 100 cc/min. (controlled by the xass flow controller 55) and $SiH_4$ gas at flow rate of 10 cc/min. (controlled by the mass flow control 56) were permitted to flow thereinto, and a high frequency power of 100W was applied. Tis condition was maintained for 10 minutes to form a-SiC layer on the non-doped a-Si layer.

After formation of the a-SiC layer, the drum was taken out of the system by moving the drum in the order of the preliminary compartment 4, and the preliminary compartment 6.

On the drum taken out, uniform films were found to be formed in the order of Al/P$^+$a-Si 3000 Å/non-doped a-Si 20 μm. The film thicknesses are values when only each of the respective layers was formed under the above conditions.

This drum was set on a copying machine, and ⊕8KV corona charging, manuscript exposure, development with ⊖ toner, transfer onto paper and fixing were conducted. As the result of evaluation of the image obtained, excellent image could be obtained.

The image was extremely small in amount of pinholes as compared with the image obtained by the drum having formed the above three layers only utilizing discharging.

EXAMPLE 2

An electrophotographic photosensitive member was prepared in the same manner as in Example 1 except for using $(CH_3)_3Si_2H_3$ in place of $CH_4$ and $SiH_4$ as the starting gas for formation in the compartment utilizing discharging for film formation in Example 1 and changing the applied voltage to 60 W.

The drum obtained was set in a copying machine and image evaluation was conducted similarly to that in Example 1. As the result, an excellent image was obtained similarly to that in Example 1.

As described above, it has been rendered possible by the present invention to form a deposited film by utilizing both decomposition or polymerization through utilization of heat and decomposition or polymerization through utilization of discharging. Accordingly, even in the case of forming various functional films on a large area substrate such as electrophotographic photosensitive members, etc., depending on the properties of the film to be formed, for example, it has been rendered possible to effect film formation primarily through utilization of heat capable of forming a film of good quality at high deposition speed on such a substrate, and to form a functional film such as a-SiC, etc., which is formed with difficulty by utilization of heat, by utilizing discharging. Thus, preparation of an apparatus having more excellent film characteristics than those of the prior art is now possible. Also, in preparation of various funcional films, since both heat and discharging can be utilized, the scope of choice of the starting materials can be broadened, whereby the respective functional layers can be formed under the optimum conditions.

I claim:

1. A method for forming a multi-layer structure deposited film having a plurality of layers on a substrate, which comprises forming at least one layer (A) of said multi-layer structure deposited film including silicon and carbon atoms by decomposition or polymerization of a first starting gas by heat, said first starting gas containing $(CH_3)_3Si_2H_3$, and forming a layer (B) of said multi-layer structure deposited film including silicon atoms by decomposition or polymerization of a second starting gas by discharge energy, said second starting gas being the same or different from said first starting gas.

2. The method according to claim 1 wherein the first starting gas comprises $SiH_4$ and $B_2H_6$.

3. The method according to claim 1 wherein the first starting gas contains Ar.

4. The method according to claim 1 wherein the first starting gas is the same as the second starting gas.

5. The method according to claim 1 wherein a second layer formed by discharging is an a-SiC layer.

6. The method according to claim 1 wherein the second starting gas is $(CH_3)_3 Si_2H_3$.

7. The method according to claim 1 wherein the second starting gas comprises $SiH_4$ and $CH_4$.

8. The method according to claim 1 wherein the second starting gas comprises $SiH_4$ and $CH_4$.

9. The method according to claim 1 wherein the second starting gas contains Ar.

* * * * *